United States Patent
Tao

(10) Patent No.: US 6,861,751 B2
(45) Date of Patent: Mar. 1, 2005

(54) ETCH STOP LAYER FOR USE IN A SELF-ALIGNED CONTACT ETCH

(75) Inventor: Wei Tao, Portland, OR (US)

(73) Assignee: Integrated Device Technology, Inc., Santa Clara, CA (US)

(*) Notice: Subject to any disclaimer, the term of this patent is extended or adjusted under 35 U.S.C. 154(b) by 0 days.

(21) Appl. No.: 10/315,573

(22) Filed: Dec. 9, 2002

(65) Prior Publication Data

US 2004/0110346 A1 Jun. 10, 2004

(51) Int. Cl.[7] .............................................. H01L 23/48
(52) U.S. Cl. .................. 257/750; 257/754; 257/755; 257/774; 438/586; 438/652; 438/740
(58) Field of Search ............................... 438/586, 591, 438/652, 666, 740; 257/750, 754, 755, 774

(56) References Cited

U.S. PATENT DOCUMENTS

| | | | |
|---|---|---|---|
| 4,997,790 A | 3/1991 | Woo et al. | |
| 5,710,073 A | 1/1998 | Jeng et al. | |
| 5,897,372 A | 4/1999 | Howard | |
| 6,136,700 A | * 10/2000 | McAnally et al. | 438/666 |
| 6,169,039 B1 | * 1/2001 | Lin et al. | 438/761 |
| 6,433,433 B1 | * 8/2002 | Sengupta | 257/763 |
| 6,472,308 B1 | * 10/2002 | Mehta | 438/624 |
| 6,573,168 B2 | * 6/2003 | Kim et al. | 438/586 |

* cited by examiner

Primary Examiner—Hsien-Ming Lee
(74) Attorney, Agent, or Firm—Bever, Hoffman & Harms, LLP

(57) ABSTRACT

A self-aligned contact, and a method for fabricating the same, are provided. A conductive element having an overlying hydrogen silsesquioxane (HSQ)-based dielectric cap is formed over a semiconductor substrate. Dielectric sidewall spacers are then formed adjacent to sidewalls of the conductive element and the HSQ-based dielectric cap. A HSQ-based dielectric layer is formed over the resulting structure, and an inter-layer dielectric layer, such as TEOS, is formed over the HSQ-based dielectric layer. The inter-layer dielectric layer is then etched through a mask having an opening located over a sidewall spacer, a portion of the HSQ-based dielectric cap and a portion of the substrate. The etch (which may be a $C_5F_8$ based etch) has a high selectivity (e.g., about 20:1) with respect to the HSQ-based dielectric layer, thereby enabling the etch to stop on the HSQ-based dielectric layer. Another etch removes the exposed HSQ-based dielectric layer to expose the substrate.

27 Claims, 6 Drawing Sheets

ETCH STOP LAYER FOR USE IN A SELF-ALIGNED CONTACT ETCH

FIELD OF THE INVENTION

The present invention relates to an improved etch-stop layer for use during a self-aligned contact etch. More specifically, the present invention relates to the use of a hydrogen silsesquioxane (HSQ)-based material as an etch stop layer in a self-aligned contact etch.

RELATED ART

In general, self-aligned contacts are area-efficient structures that are used to provide connection between a semiconductor substrate and an overlying conductive layer. Self-aligned contacts are typically formed adjacent to one or more dielectric sidewall spacers.

FIG. 1A is a cross sectional diagram of a conventional semiconductor structure 100, where a self-aligned contact is to be fabricated. Semiconductor structure 100 includes semiconductor substrate 101, gates 102 (which include gate dielectric film 103, conductive film 104, and insulating cap 106), insulating sidewalls 108, stopping layer 110, inter-layer dielectric 112, and mask 116. Mask 116 has an opening that defines a contact region 118 where the self-aligned contact will be formed.

An etch is performed through the opening in mask 116, thereby removing the exposed portions of inter-layer dielectric 112. It is desirable for this etch to stop on stopping layer 110. If the etch proceeds through stopping layer 110, it is possible that this etch may quickly remove exposed portions of insulating cap 106 or insulating sidewalls 108. If this occurs, the subsequently formed self-aligned contact may undesirably contact conductive film 104, thereby resulting in a short. After the etch is performed, mask 116 is stripped, resulting in the structure illustrated in FIG. 1B.

The exposed portions of stopping layer 110 are then etched. Again, it is desirable for this etch to stop after removing the exposed portions of stopping layer 110, without removing significant portions of the underlying insulating cap 106 and insulating sidewalls 108. FIG. 1C illustrates semiconductor structure 100 after stopping layer 110 has been etched. A self-aligned contact 120 is then formed in contact region 118 in the manner illustrated by FIG. 1D.

Insulating cap 106 and stopping layer 110 are typically formed from silicon nitride (SiN), silicon oxynitride (SiON), or a combination of silicon nitride and/or silicon oxynitride with oxide. However, the on-current ($I_{ON}$) and off-current ($I_{OFF}$) characteristics of a short-channel NMOSFET are degraded by the presence of a nitride etch stop layer. ("Mechanical Stress Effect of Etch-stop Nitride and its Impact on Deep Submicron Transistor Design", Shinya Ito, et al., International Electron Devices Meeting, San Francisco, Calif., Dec. 10–13, 2000, Page 247.)

In addition, the SiN/SiON insulating cap 106 and stopping layer 110 may have to be etched (in locations outside the view of FIG. 1D), in order to allow contact to conductive film 104. It is therefore desirable for this additional SiN/SiON etch step to generate less etch bias, which is very critical as the geometry shrinks.

U.S. Pat. No. 6,136,700 by McAnally et al. suggests other materials for stopping layer 110, including: silicon rich nitride, carbon rich nitride, silicon rich oxide, organic SOG, silicon carbide, carbon rich oxide, nitrided oxide, organic polymers, graphite, diamond and boron nitride.

It would be desirable to have an improved semiconductor structure for implementing self-aligned contacts.

SUMMARY

Accordingly, the present invention provides a semiconductor structure that includes a semiconductor substrate, and a conductive element located over the semiconductor substrate. The conductive element can be, for example, a trace or a gate electrode having a polycide structure that includes a polysilicon layer and an overlying refractory metal layer. An insulating material, such as a gate dielectric layer or a shallow trench isolation region, can be used to isolate the conductive element from the substrate.

A hydrogen silsesquioxane (HSQ)-based dielectric cap is located on the conductive element. In one embodiment, this HSQ-based dielectric cap can be formed by FOx® Flowable Oxide, which is a HSQ-based film available from Dow Corning, Midland, Mich. In another embodiment, this HSQ-based dielectric cap can be formed by Tokyo Ohka Koyga spin-on-glass (TOK SOG) which is a HSQ-based film available from Tokyo Ohka Koyga, 150 Nakamaruko, Nakahara-ku, Kawasaki-shi, Kanagawa Prefecture 211-0012 Japan.

One or more dielectric sidewall spacers are located adjacent to sidewalls of the conductive element and the HSQ-based dielectric cap. These dielectric sidewall spacers can be formed, for example, by silicon nitride and/or silicon oxynitride.

An HSQ-based dielectric layer is located over the HSQ-based dielectric cap, the dielectric sidewall spacers and the semiconductor substrate. In various embodiments, this HSQ-based dielectric layer can be FOx® Flowable Oxide or TOK SOG.

An inter-layer dielectric, such as tetraethyl orthosilicate (TEOS), is located over the HSQ-based dielectric layer. A mask is formed over the inter-layer dielectric, wherein the mask includes an opening located over the sidewall spacer, a portion of the HSQ-based dielectric cap and a portion of the substrate. A first etch is performed through the mask, thereby removing portions of the inter-dielectric dielectric layer exposed through the mask opening. The first etch forms an opening through the first dielectric layer.

The first etch is stopped on the HSQ-based dielectric layer. The first etch has a high selectivity with respect to the HSQ-based dielectric layer, thereby making it easy to completely remove the inter-layer dielectric within the opening, without etching through the HSQ-based dielectric layer. In one embodiment, the etch selectivity of the first etch is on the order of about 20:1. A $C_5F_8$-based etchant can be used to achieve such an etch selectivity.

A second etch can then be performed through the opening in the inter-layer dielectric layer. The second etch removes the exposed portion of the HSQ-based dielectric layer. At this time, the dielectric sidewall spacer and an adjacent portion of the substrate are exposed through the opening. The second etch has a high etch selectivity with respect to the dielectric sidewall spacer and the semiconductor substrate.

After the second etch is complete, a self-aligned contact can be deposited into the opening of the inter-layer dielectric layer. The self-aligned contact provides an area efficient electrical contact to the semiconductor substrate.

The present invention will be more fully understood in view of the following description and drawings.

DETAILED DESCRIPTION

Figure 1A:
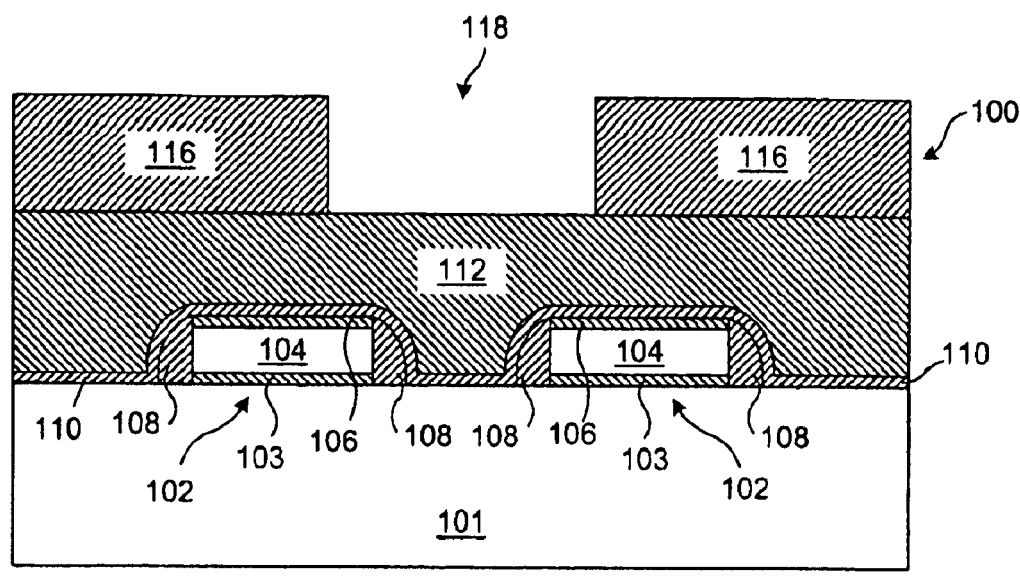
FIG. 1A is a cross sectional diagram of a conventional semiconductor structure, where a self-aligned contact is to be fabricated.
Figure 1B:
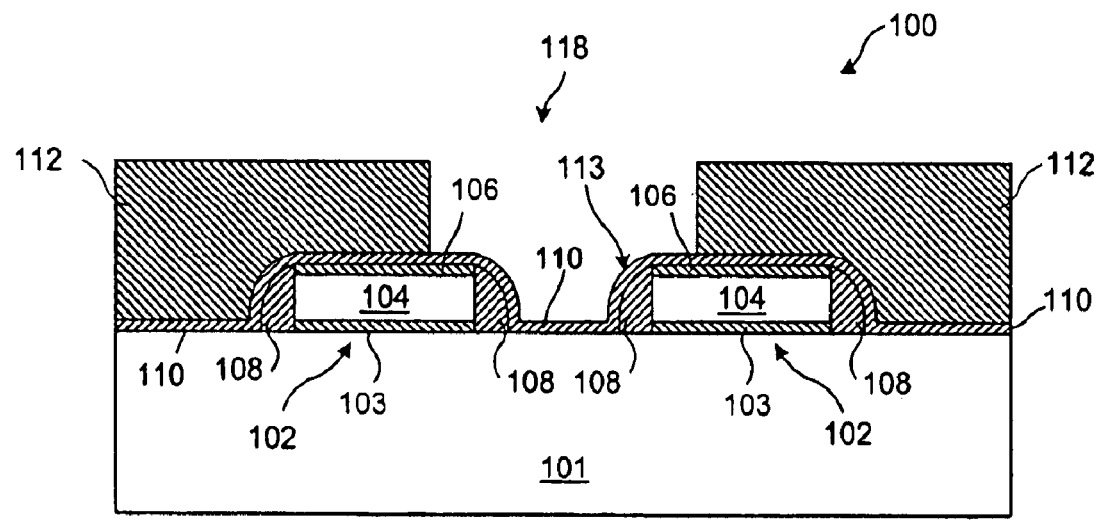
FIG. 1B is a cross sectional diagram of the conventional semiconductor structure of FIG. 1A, after an etch has been performed.
Figure 1C:
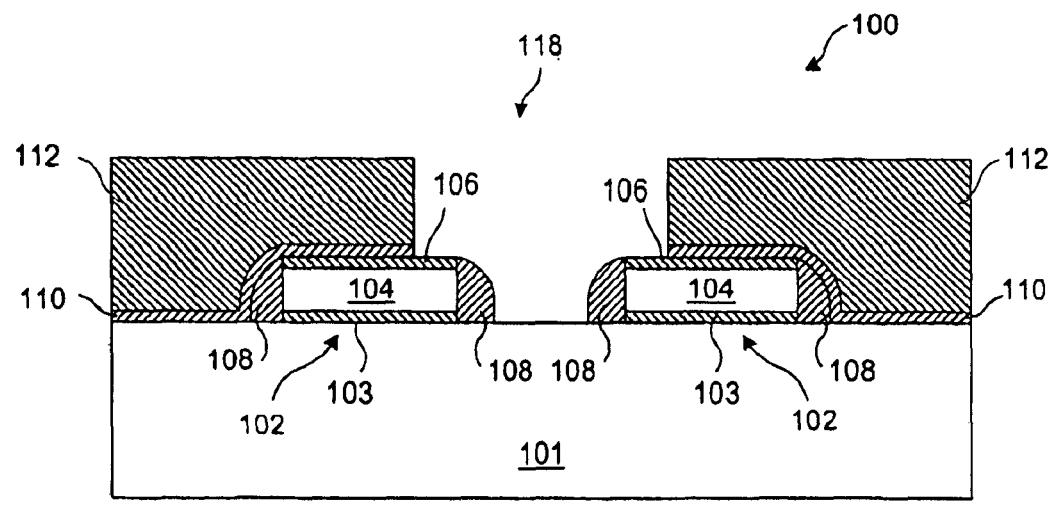
FIG. 1C is a cross sectional diagram of the conventional semiconductor structure of FIG. 1B, after the exposed portions of a stopping layer have been etched.
Figure 1D:
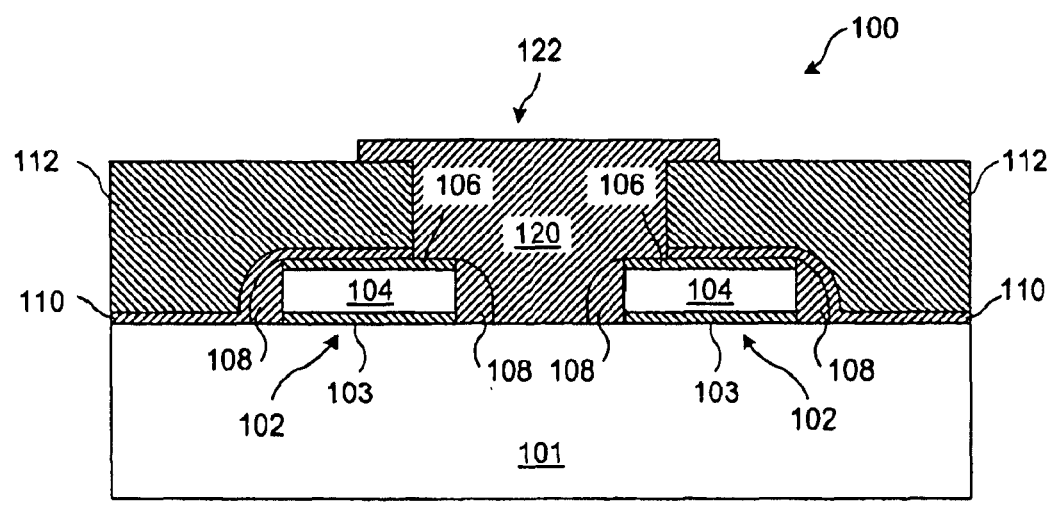
FIG. 1D is a cross sectional diagram of the conventional semiconductor structure of FIG. 1C, after the formation of a self-aligned contact.
Figure 2:
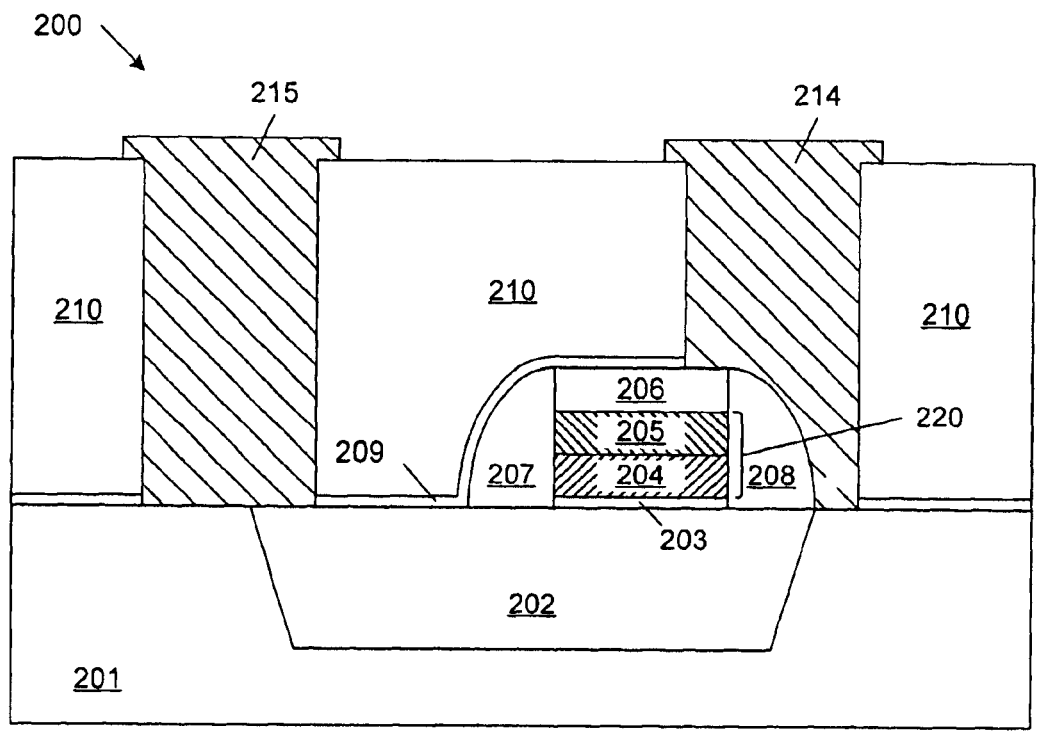
FIG. 2 is a cross sectional view of a semiconductor structure in accordance with one embodiment of the present invention.

FIG. 2 is a cross sectional view of a semiconductor structure 200 in accordance with one embodiment of the present invention. Semiconductor structure 200 includes semiconductor substrate 201, shallow trench isolation (STI) region 202, gate dielectric layer 203, conductive element 220, which includes lower conductive element 204 and upper conductive element 205, hydrogen silsesquioxane (HSQ)-based dielectric cap 206, dielectric sidewall spacers 207–208, HSQ-based conformal dielectric layer 209, inter-layer dielectric 210 and self-aligned contact 214 and contact 215.

In the described embodiment, lower conductive element 204 is conductively doped polycrystalline silicon (polysilicon), and upper conductive element 205 is a refractory metal silicide. However, conductive element 220 can be formed from different conductive materials in other embodiments. Moreover, conductive element 220 may include only a single conductive layer (or more than two conductive layers) in other embodiments. Conductive element 220 may represent, for example, a gate electrode of a transistor and/or a conductive trace of an integrated circuit chip.

Self-aligned contact 214 and contact 215 extend through openings in inter-layer dielectric layer 210 and HSQ-based dielectric layer 209 in order to contact substrate 201. In other embodiments, contacts 214–215 can contact various regions in substrate 201. For example, contacts 214–215 can contact an n-type well region or a p-type well region in substrate 201. Similarly, contacts 214–215 can contact n-type or p-type source/drain regions in substrate 201.

As described in more detail below, HSQ-based dielectric cap 206 and HSQ-based dielectric layer 209 have a high etch selectivity with respect to inter-layer dielectric layer 210, thereby ensuring that inter-layer dielectric layer 210 can be completely etched, without etching through HSQ-based dielectric cap 206 or HSQ-based dielectric layer 209. Because the HSQ-based dielectric cap 206 and HSQ-based dielectric layer 209 remain largely intact, self-aligned contact 214 will not undesirably short to conductive element 220.

In addition, HSQ-based dielectric layer 209 has a high etch selectivity with respect to dielectric sidewall spacers 207–208. As a result, HSQ-based dielectric layer 209 can be completely etched, without etching through sidewall dielectric spacer 208. Because sidewall dielectric spacer 208 remains intact, self-aligned contact 214 will not undesirably short to conductive element 220.

Moreover, if conductive element 220 is a gate electrode, it will be necessary to etch through HSQ-based dielectric layer 209 and HSQ-based dielectric cap 206 in order to provide a contact to conductive element 220. In this case, the high etch selectivity advantageously allows an etch to remove portions of HSQ-based dielectric layer 209 and HSQ-based dielectric cap 206, while dielectric sidewall spacers 207–208 remain substantially intact.

Figure 3A:
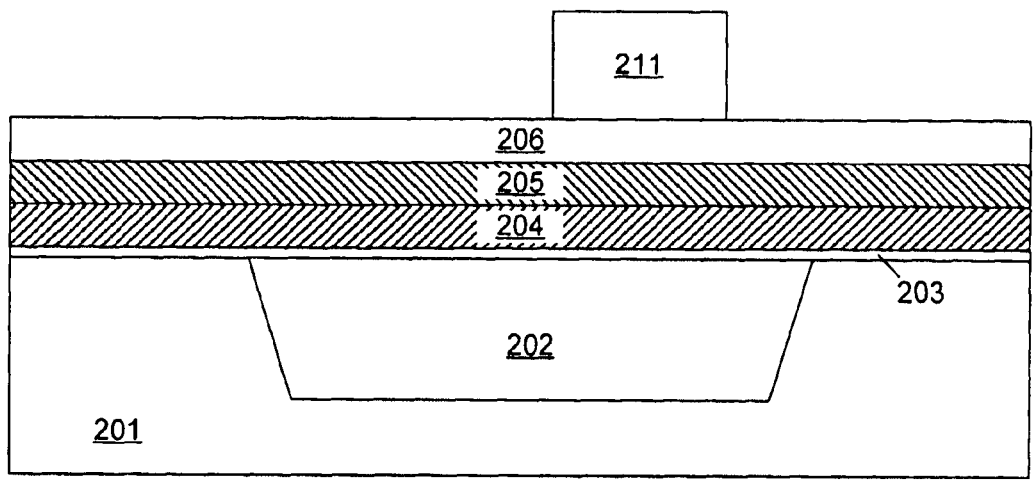
FIG. 3A is a cross sectional views illustrating the semiconductor structure of FIG. 2 during one stage of fabrication, after the formation of a shallow trench isolation region, a gate dielectric layer, conductive layers, an HSQ-based dielectric cap layer, and a mask.

FIGS. 3A–3F are cross sectional views illustrating semiconductor structure 200 during various stages of fabrication. As illustrated in FIG. 3A, STI region 202 is formed in semiconductor substrate 201 using conventional semiconductor processing techniques. STI region 202 may be replaced with other types of insulating layers in other embodiments. For example, STI region 202 may be replaced with planarized field oxide. STI region 202 (or its equivalent) functions to isolate the overlying conductive element 220 from substrate 201. In the described embodiment, substrate 201 is monocrystalline silicon and STI region 202 is silicon oxide. However, these elements can have different compositions in different embodiments.

Gate dielectric layer 203 is formed over the upper surface of substrate 201 and STI region 202. Gate dielectric layer 203 can be, for example, thermally grown silicon oxide or a deposited layer of dielectric material, such as silicon oxide or silicon nitride. Other gate dielectric materials can be used in other embodiments.

Lower conductive layer 204 is formed over gate dielectric layer 203. In the described embodiment, lower conductive layer 204 is formed by depositing a layer of conductively doped polycrystalline silicon, using conventional processing techniques.

Upper conductive layer 205 is formed over the upper surface of lower conductive layer 204. In the described embodiment, upper conductive layer 205 is a refractory metal silicide. For example, upper conductive layer 205 can be tungsten silicide. The refractory metal silicide can be deposited over lower conductive layer 204. Alternately, the refractory metal silicide can be formed by depositing a refractory metal layer, and then reacting this refractory metal layer with the underlying conductive layer 204.

HSQ-based dielectric layer 206 is formed over the upper surface of upper conductive layer 205 to a thickness in the range of about 500 to 4000 Angstroms. In one embodiment, HSQ-based dielectric layer 206 is FOx® Flowable Oxide, which is a hydrogen silsesquioxane-based film available from Dow Corning. In another embodiment, HSQ-based layer 206 is Tokyo Ohka Koyga spin-on-glass (TOK SOG) which is a hydrogen silsesquioxane-based film available from Tokyo Ohka Koyga. The curing process, which includes such variables as temperature, time and environment, is precisely controlled to provide a high quality FOx® Flowable Oxide or TOK SOG film. As described in more detail below, the HSQ-based layer 206 exhibits advantageous etch characteristics when forming a self-aligned contact.

A photoresist mask 211 is formed over the upper surface of HSQ-based dielectric layer 206. Mask 211 is patterned to define the location of conductive element 220 and HSQ-based cap 206.

Figure 3B:
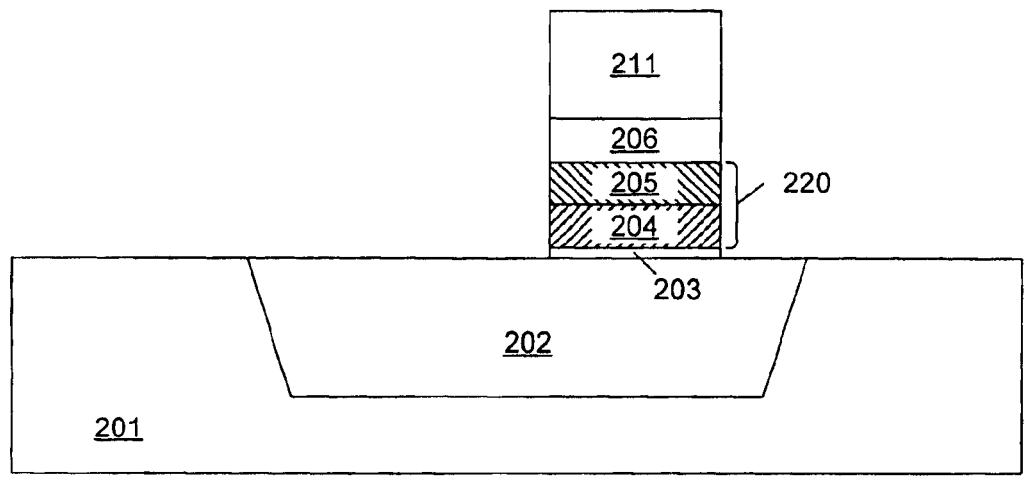
FIG. 3B is a cross sectional views illustrating the semiconductor structure of FIG. 2 during another stage of fabrication, after a series of etches.

As illustrated in FIG. 3B a series of etches is performed through mask 211, thereby removing the exposed portions of gate dielectric layer 203, lower conductive layer 204, upper conductive layer 205 and HSQ-based layer 206, thereby forming lower conductive element 204, upper conductive element 205 and HSQ-based dielectric cap 206.

Figure 3C:
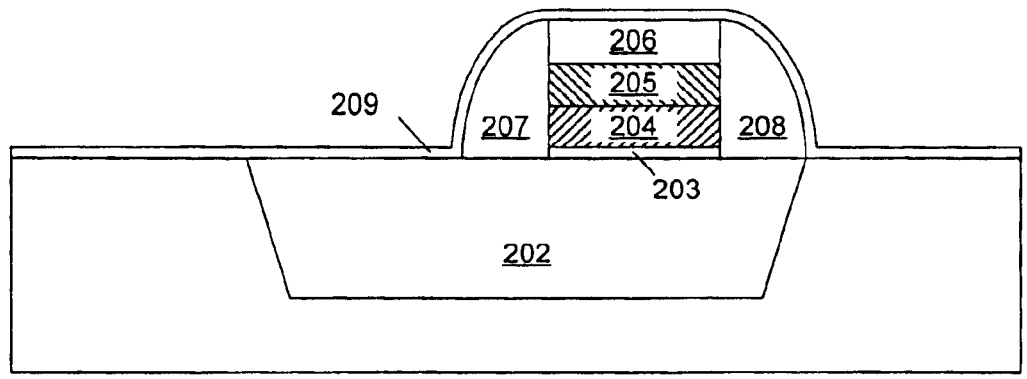
FIG. 3C is a cross sectional views illustrating the semiconductor structure of FIG. 2 during another stage of fabrication, after the formation of sidewall spacers and an HSQ-based dielectric layer.

As illustrated in FIG. 3C, mask 211 is removed and dielectric sidewall spacers 207-208 are formed adjacent to sidewalls of gate dielectric layer 203, lower conductive element 204, upper conductive element 205 and HSQ-based dielectric cap 206. HSQ-based conformal dielectric layer 209 is then formed over the resulting structure. In the described embodiment, HSQ-based dielectric layer 209 has a thickness in the range of about 100 to 600 Angstroms, and typically in the range of about 200 to 300 Angstroms. Again, the curing parameters are precisely controlled to ensure that the HSQ-based dielectric layer 209 is a high-quality film. Dielectric sidewall spacers 207–208 are formed in a conventional manner (i.e., by depositing a dielectric layer over the resulting structure, and then performing an isotropic etch). In the described embodiment, dielectric sidewall spacers 207-208 are silicon nitride (SiN) and/or silicon oxynitride (SiON). Dielectric sidewall spacers 207-208 are selected to have a high etch selectivity with respect to HSQ-based dielectric cap 206 and HSQ-based layer 209.

HSQ-based dielectric layer 209 can be, for example, FOx® Flowable Oxide from Dow Corning or TOK SOG from Tokyo Ohka Koyga. As described in more detail below, the HSQ-based layer 209 exhibits advantageous etch characteristics when forming a self-aligned contact.

Figure 3D:
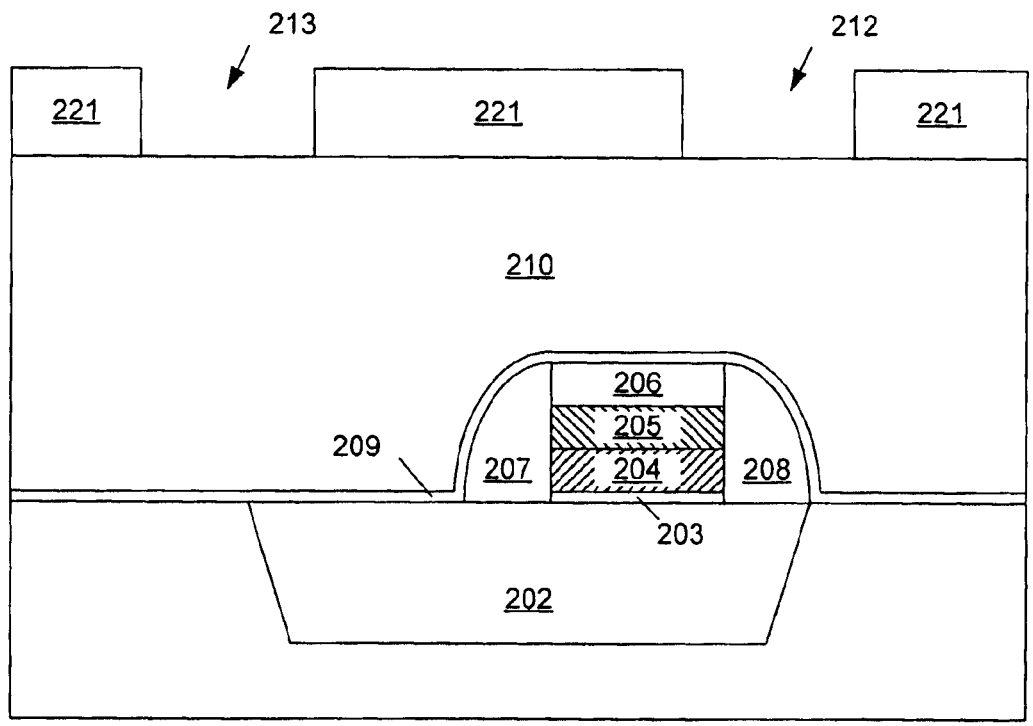
FIG. 3D is a cross sectional views illustrating the semiconductor structure of FIG. 2 during another stage of fabrication, after the formation of an inter-layer dielectric layer and a mask.

As illustrated in FIG. 3D, an inter-layer dielectric layer 210 is formed over HSQ-based dielectric layer 209. In the described embodiment, inter-layer dielectric layer 210 is tetraethyl orthosilicate (TEOS), deposited to a thickness of about 4000 to 15,000 Angstroms. This TEOS layer exhibits desirable etch properties, as described in more detail below. In other embodiments, inter-layer dielectric layer 210 can be made of other dielectric materials that exhibit the same desirable etch characteristics as TEOS. A photoresist mask 221 is formed over inter-layer dielectric layer 210. Photoresist mask 221 includes openings 212–213, which define the locations of the subsequently formed contacts 214–215.

Figure 3E:
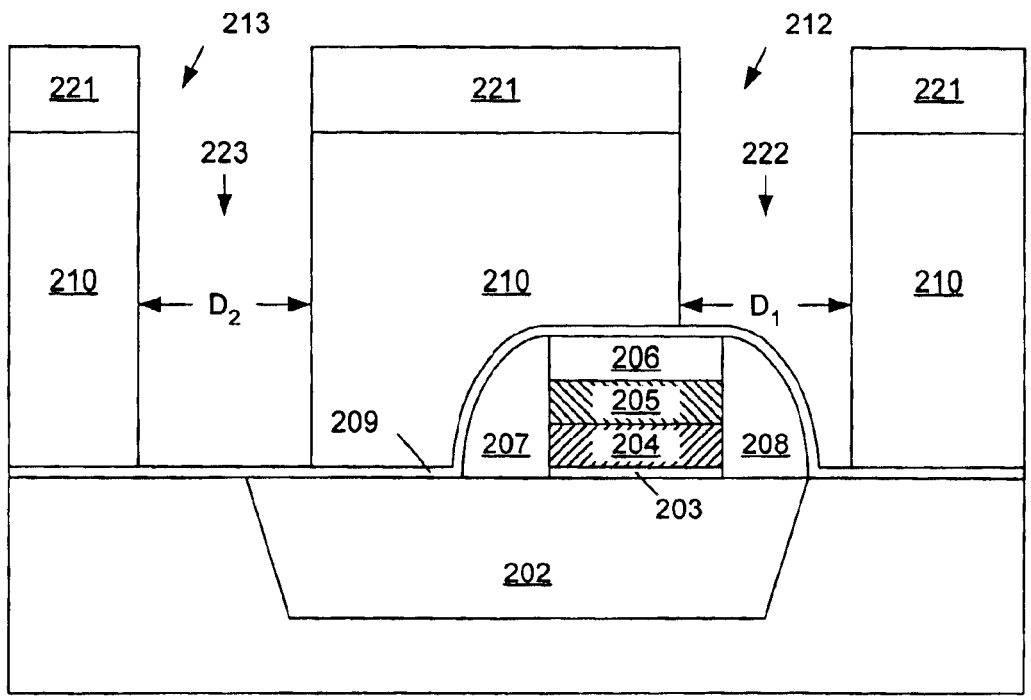
FIG. 3E is a cross sectional views illustrating the semiconductor structure of FIG. 2 during another stage of fabrication, after an etch is performed through the mask of FIG. 3D.

As illustrated in FIG. 3E, an etch is performed through openings 212–213 of mask 221, thereby removing the exposed portions of inter-layer dielectric layer 210 to form openings 222–223 through inter-layer dielectric layer 210. In the described embodiment, this etch is performed using a gas mixture of 18 sccm $C_5F_8$, 36 sccm CO, 405 sccm Ar and 18 sccm $O_2$ at a pressure of 40 milli-Torr (mT), a power of 1700 Watts, a Helium pressure of 9–40 Torr, and a temperature of 60° C. Note that the lower Helium pressure is for the center of the chuck and the higher Helium pressure is for the edge of the chuck.

Under these conditions, the etch rate of TEOS inter-layer dielectric layer 210 is about 5900 Angstroms/minute and is capable of etching openings 222–223 having minimum dimensions $D_1$–$D_2$ of about 0.13 μm. The $C_5F_8$ based recipe therefore has a good oxide etch rate with a very small contact size.

The etch rate of HSQ-based dielectric layer 209 (and HSQ-based dielectric cap 206) is significantly less than the etch rate of inter-dielectric layer 210. For example, if HSQ-based dielectric layer 209 is FOx® Flowable Oxide, the etch rate of HSQ-based dielectric layer 209 is about 280 Angstroms/minute. Similarly, if HSQ-based dielectric layer 209 is TOK SOG, the etch rate of HSQ-based dielectric layer 209 is about 1155 Angstroms/minute. The TOK SOG etch rate can be reduced by modifying the etch process.

The high etch selectivity allows this etch to be reliably controlled to completely remove the inter-layer dielectric material within openings 222–223 and stop on HSQ-based dielectric layer 209, without etching through this layer 209. As a result, this etch does not remove portions of dielectric spacer 208, thereby preventing a subsequent short between self-aligned contact 214 and conductive element 220.

Figure 3F:
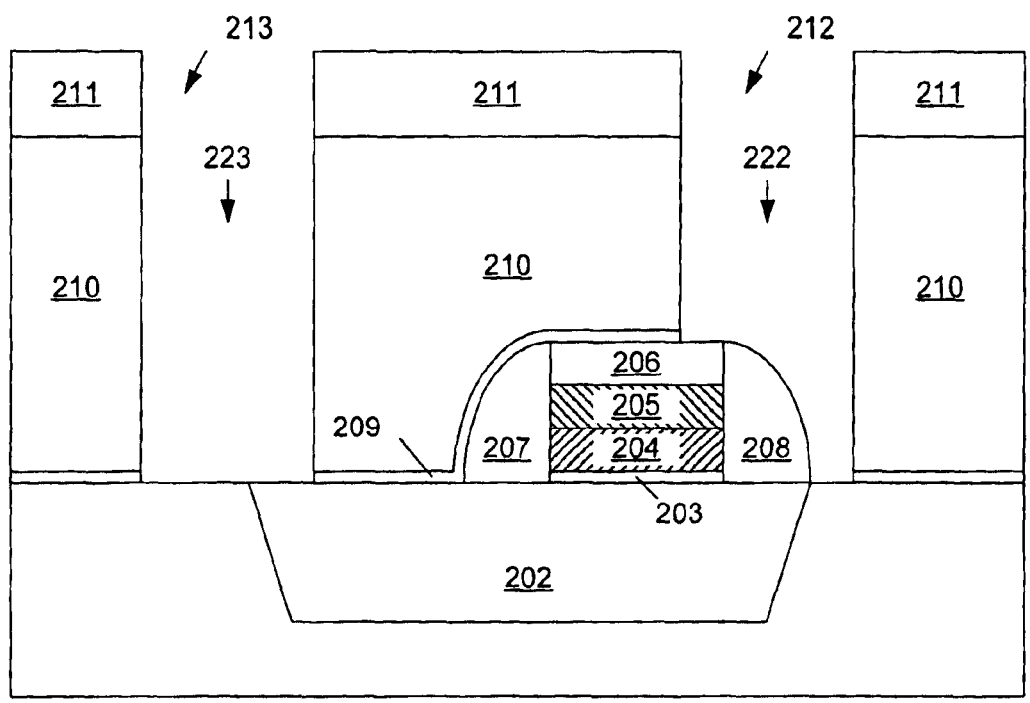
FIG. 3F is a cross sectional views illustrating the semiconductor structure of FIG. 2 during another stage of fabrication, after exposed portion of the HSQ-based dielectric layer are removed.

As illustrated in FIG. 3F, an HSQ dielectric etch is performed to remove the portions of HSQ-based dielectric layer 209 exposed through openings 222–223. In the described embodiment, this etch is performed using a gas mixture of 20 sccm $C_4F_8$, 50 sccm CO, 250 sccm Ar and 10 sccm $O_2$ at a pressure of 30 milli-Torr (mT), a power of 1700 Watts, a Helium pressure of 7–30 Torr, and a temperature of 60° C. Again, the lower Helium pressure is for the center of the chuck and the higher Helium pressure is for the edge of the chuck. This HSQ dielectric etch will typically have a high selectivity with respect to the underlying sidewall dielectric spacer 208, the underlying STI region 202, and the underlying substrate 201. For example, if HSQ-based dielectric layer 209 is FOx® Flowable Oxide, the etch rate of HSQ-based dielectric layer 209 is about 6000 Angstroms/minute. Similarly, if HSQ-based dielectric layer 209 is TOK SOG, the etch rate of HSQ-based dielectric layer 209 is about 6000 Angstroms/minute. In contrast, the etch rate of silicon nitride is about 300 Angstroms/minute, the etch rate of silicon oxynitride is about 300 Angstroms/minute, and the etch rate of monocrystalline silicon is about 200 Angstroms/minute. Thus, the etch selectivity of this second etch is on the order of about 20:1 with respect to silicon nitride, silicon oxynitride and monocrystalline silicon.

In contrast, the etch rate of silicon oxide is about 6000 Angstroms/minute. Thus, the etch selectivity of the second etch is on the order of about 1:1 with respect to silicon oxide. However, the etch time of this second etch is typically very short, because the HSQ-based dielectric layer 209 is relatively thin (e.g., 200 to 300 Angstroms). Thus, a 50% over-etch will only consume about 100 to 150 Angstroms of an underlying silicon oxide STI layer 202. The loss of 100 to 150 Angstroms of a silicon oxide STI region 202 is acceptable. (Note that the loss of 100 to 150 Angstroms of a silicon oxide sidewall spacer 208 may also be acceptable, depending on the sidewall spacer thickness.)

The high etch selectivity allows the HSQ dielectric etch to be reliably controlled to completely remove the portions of HSQ-based dielectric layer 209 within openings 222–223, without significantly etching through dielectric sidewall spacer 208, STI region 202 and substrate 201. The duration of the etch is controlled such that the etch completely removes the exposed portions of HSQ-based dielectric layer 209, without completely etching through HSQ-based cap 206. Thus, at the end of the etch, substrate 201 is exposed through openings 222 and 223, and sidewall spacers and HSQ-based cap 206 remain largely intact.

Mask 221 is then removed, and self-aligned contact 214 and contact 215 are then formed in openings 222 and 223, as illustrated in FIG. 2, thereby completing semiconductor structure 200.

Additional masking/etching/contact formation steps can be performed to provide contact with conductive element 220, outside the plane of FIG. 2. These masking, etching and contact formation steps can be similar to those described above in connection with FIGS. 2 and 3D–3F.

Although the invention has been described in connection with several embodiments, it is understood that this invention is not limited to the embodiments disclosed, but is capable of various modifications, which would be apparent to a person skilled in the art. Thus, the invention is limited only by the following claims.

I claim:

1. A semiconductor structure for forming a self-aligned contact, the semiconductor structure comprising:
   a semiconductor substrate;
   a conductive element located over the semiconductor substrate;
   a hydrogen silsesquioxane (HSQ)-based dielectric cap located on the conductive element;
   a dielectric sidewall spacer located adjacent to a sidewall of the conductive element and the HSQ-based dielectric cap; and
   a hydrogen silsesquioxane (HSQ)-based dielectric layer located on the HSQ-based dielectric cap, the dielectric sidewall spacer and a portion of the semiconductor substrate.

2. The semiconductor structure of claim 1, wherein the HSQ-based dielectric cap and the HSQ-based dielectric layer comprise an HSQ-based flowable oxide.

3. The semiconductor structure of claim 1, wherein the HSQ-based dielectric cap and the HSQ-based dielectric layer comprise an HSQ-based spin-on-glass.

4. The semiconductor structure of claim 1, wherein the dielectric sidewall spacer comprises silicon nitride and/or silicon oxynitride.

5. The semiconductor structure of claim 1, wherein the conductive element comprises a conductively doped polycrystalline silicon layer.

6. The semiconductor structure of claim 5, wherein the conductive element comprises a refractory metal silicide layer contacting the conductively doped polycrystalline silicon layer.

7. The semiconductor structure of claim 1, further comprising a gate dielectric layer between the conductive element and the semiconductor substrate.

8. The semiconductor structure of claim 1, further comprising a shallow trench isolation region between the conductive element and the semiconductor substrate.

9. The semiconductor structure of claim 1, further comprising an inter-layer dielectric located over the HSQ-based dielectric layer.

10. The semiconductor structure of claim 9, wherein the inter-layer dielectric comprises tetraethyl orthosilicate (TEOS).

11. The semiconductor structure of claim 9, further comprising:
    an opening through the inter-layer dielectric and the HSQ-based dielectric layer, wherein the opening exposes the dielectric sidewall spacer and a portion of the semiconductor substrate adjacent to the dielectric sidewall spacer; and
    a conductive contact located in the opening and contacting the portion of the semiconductor substrate.

12. The semiconductor structure of claim 11, wherein the opening exposes the HSQ-based dielectric cap.

13. A method of fabricating a self-aligned contact, the method comprising:
    forming a conductive element over a semiconductor substrate;
    forming a hydrogen silsesquioxane (HSQ)-based dielectric cap over the conductive element;
    forming a dielectric sidewall spacer adjacent to a sidewall of the conductive element and the overlying HSQ-based dielectric cap;
    forming a HSQ-based dielectric layer over the dielectric sidewall spacer, the semiconductor substrate and the HSQ-based dielectric cap;
    forming a first dielectric layer over the HSQ-based dielectric layer;
    forming a mask over the first dielectric layer, wherein the mask includes an opening located over the dielectric sidewall spacer, a portion of the HSQ-based dielectric cap and a portion of the semiconductor substrate;
    performing a first etch through the mask, wherein the first etch removes portions of the first dielectric layer exposed through the opening of the mask, whereby the first etch forms an opening through the first dielectric layer; and
    stopping the first etch on the HSQ-based dielectric layer.

14. The method of claim 13, further comprising performing a second etch through the opening in the first dielectric layer, thereby removing a portion of the HSQ-based dielectric layer and exposing a portion of the semiconductor substrate.

15. The method of claim 14, wherein the portion of the substrate is adjacent to the dielectric sidewall spacer.

16. The method of claim 14, wherein the second etch exposes the dielectric sidewall spacer.

17. The method of claim 14, further comprising removing the mask prior to the second etch.

18. The method of claim 14, further comprising depositing a conductive contact into the opening of the first dielectric layer after the second etch, wherein the conductive contact is in electrical contact with the semiconductor substrate.

19. The method of claim 13, wherein the HSQ-based dielectric cap and the HSQ-based dielectric layer comprise an HSQ-based flowable oxide.

20. The method of claim 13, wherein the HSQ-based dielectric cap and the HSQ-based dielectric layer comprise an HSQ-based spin-on-glass.

21. The method of claim 13, wherein the dielectric sidewall spacer comprises silicon nitride and/or silicon oxynitride.

22. The method of claim 13, wherein the conductive element comprises conductively doped polycrystalline silicon.

23. The method of claim 22, wherein the conductive element further comprises a refractory metal silicide.

24. The method of claim 13, further comprising forming a gate dielectric layer over the semiconductor substrate, wherein the conductive element is located on the gate dielectric layer.

25. The method of claim 13, further comprising forming a shallow trench isolation region in the semiconductor substrate, wherein the conductive element is located over the shallow trench isolation region.

26. The method of claim 13, wherein the dielectric layer comprises tetraethyl orthosilicate (TEOS).

27. The method of claim 26, wherein the first etch is performed using $C_5F_8$.

* * * * *